United States Patent [19]
Petersen et al.

[11] Patent Number: 4,494,818
[45] Date of Patent: Jan. 22, 1985

[54] MOUNTING MEMBER FOR ELECTRICAL CONTACTS

[75] Inventors: Carl C. Petersen, Binghamton; Stephen A. McKeown, Unadilla; Richard W. Normann, Otego, all of N.Y.

[73] Assignee: Allied Corporation, Southfield, Mich.

[21] Appl. No.: 529,419

[22] Filed: Sep. 6, 1983

[51] Int. Cl.³ .............................................. H01R 9/09
[52] U.S. Cl. ............................ 339/192 R; 339/17 LC
[58] Field of Search ............. 339/17 R, 17 C, 17 LC, 339/192 R, 195 M, 196 R, 196 M, 4, 220 R, 220 T, 176 M, 278 M, 59 M, 17 L, 17 LM; 29/884

[56] References Cited

U.S. PATENT DOCUMENTS

| | | | |
|---|---|---|---|
| 2,740,097 | 3/1956 | Edelman et al. | 339/17 |
| 2,934,100 | 4/1960 | Huber et al. | 140/102 |
| 3,174,517 | 3/1965 | Wilson | 140/123 |
| 3,229,727 | 1/1966 | Kenlon | 140/120.5 |
| 3,701,071 | 10/1972 | Landman | 339/4 |
| 3,852,878 | 12/1974 | Munro | 29/629 |
| 4,171,855 | 10/1979 | Raskin | 339/17 |
| 4,241,965 | 12/1980 | Wilson | 339/4 |

FOREIGN PATENT DOCUMENTS

| | | | |
|---|---|---|---|
| 489941 | 1/1953 | Canada. | |
| 2095485 | 9/1980 | United Kingdom | 339/17 LC |

*Primary Examiner*—Neil Abrams
*Attorney, Agent, or Firm*—R. J. Eifler

[57] ABSTRACT

A one-piece molded unitary plastic member (10) having a planar portion (15) with a plurality of apertures (16) that is integrally hinged (17) to a base (11) having a plurality of passages (14) for receiving contacts (50). When contacts (50) are placed in the passages (14) in the base (11) with the terminal portion (52) of each contact (50) extending through a respective aperture (16) in the planar portion (15), and the planar portion (15) is moved to a position perpendicular to the base (11), the terminal portions (52) of all the contacts (50) are bent in one operation at a 90 degree angle.

6 Claims, 4 Drawing Figures

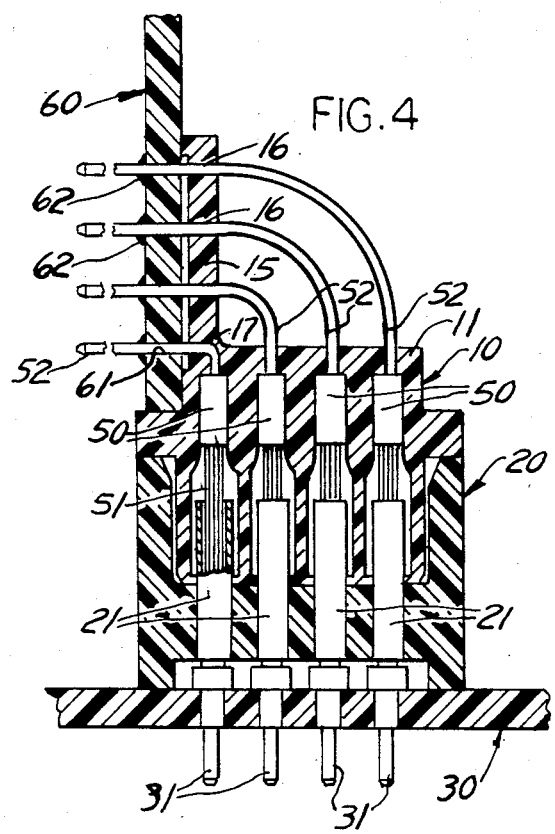
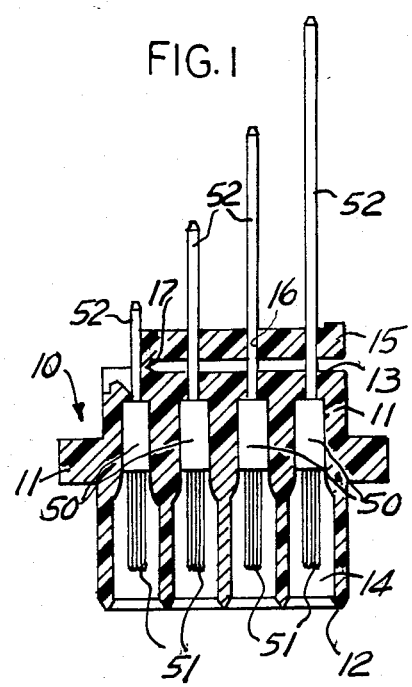
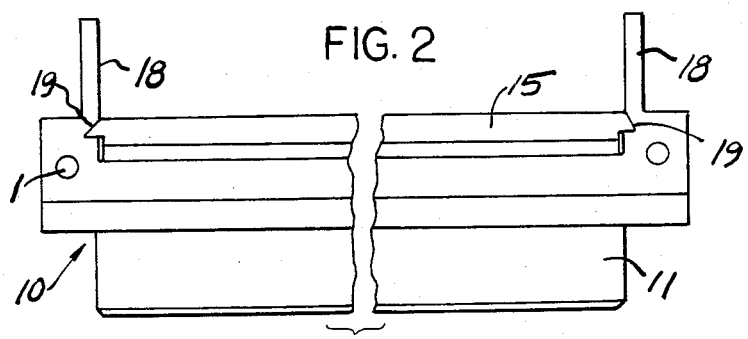
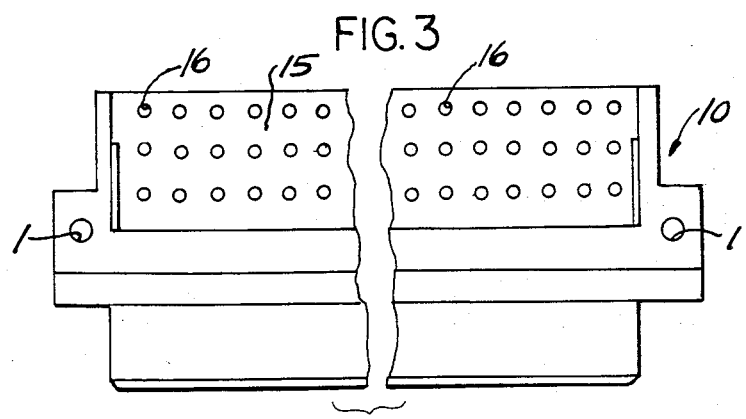

MOUNTING MEMBER FOR ELECTRICAL CONTACTS

This invention relates to electrical connectors of the type used to connect together circuit boards.

An electrical connector for connecting together two circuit boards includes a receptacle or mother board and a plug or daughter board. The mother board and daughter board both have pin type contacts that enter plated through holes in resepctive circuit boards. In most applications, two circuit boards are connected together perpendicular to each other by a daughter board connected to a mother board. This arrangement requires that one end portion of each contact, extending from the daughter board, be bent or curved into the plated through holes in one of the circuit boards. This was accomplished by bending each of the contacts, one at a time. One example of a mother board and daughter board connector may be found in U.S. Pat. No. 3,701,071 issued Oct. 24, 1972 and entitled "Hinge Type Circuit Board Connector Block."

DISCLOSURE OF THE INVENTION

This invention facilitates an electrical connection between circuit boards mounted perpendicular to each other. The invention is characterized by a one piece molded unitary member having a planar portion with a plurality of apertures that is integrally hinged to a base portion having a plurality of passages for receiving contacts. When contacts are placed in the passages in the base, with their terminal portions extending through the apertures of the planar portion and the planar portion is moved 90 degrees, the terminal portion of each contact is bent 90 degrees in one operation. The terminal portions of the contacts are then arranged to receive the plated through holes of a circuit board.

Accordingly, it is an advantage of this invention to simultaneously bend each terminal of a plurality of contacts in one operation to accommodate the right angle mounting and electrical connection of one circuit board to another.

FIG. 1 illustrates a mounting member incorporating the principles of this invention.

FIGS. 2 and 3 illustrate cut away side views of the mounting member.

FIG. 4 is a partial cutaway view of an assembly using the mounting member to connect together two circuit boards.

Referring now to the drawing, FIG. 1 illustrates a mounting member 10 that is a plastic one piece molded unitary member. The mounting member 10 includes a base 11 having a forward end 12, a rear end 13, a plurality of passages 14 extending between the forward end 12 and the rear end 13, a planar portion 15 located in a plane parallel to the rear end 13 of the base 11 and having a plurality of apertures 16 therein, and a hinge portion 17 integral with the planar portion 15 and base 11. Mounted in each of the passages 14 of the base 11 is a contact 50. Each contact 50 includes a forward mating portion 51 and a rear terminal portion that is a rearwardly extending and bendable conductor 52 that extends out of the rear end 13 of the base 11 and through the passages 16 in the planar portion 15.

FIG. 2 is a partial side view of the mounting member 10 and illustrates the planar portion 15 located in its original position parallel to the rear end 13 of the base 11. The mounting member 10 also includes two rearwardly extending posts 18 adapted to engage a resiliently deflectable extension 19 on each side of the planar portion 15. The extensions 19 are adapted to snap behind the posts 18 when the planar portion 15 is moved 90 degrees so as to maintain the planar portion 15 in its new position.

FIG. 3 illustrates the mounting member 10 with the planar portion 15 moved 90 degrees from its original position. The planar portion 15 is maintained in this position by the side extensions of the planar portion 15 that resiliently deflected and snapped into place behind the posts 18. Holes 1 are located at each end of the member 10 and are adapted to receive a member to secure a printed circuit board to the mounting member 10.

FIG. 4 illustrates a cross-section of an assembly electrically connecting and mounting a first circuit board 30 perpendicular to a second printed circuit board 60. The contacts 31 of the first circuit board 30 connect to the contacts 21 of the mother board 20 which in turn are connected to the forward mating portion 51 of the contact 50 mounted in the mounting member 10. The rearwardly extending and bendable conductors 52 of each contact 50 extend through the aperture 16 of the planar portion 15 and through the plated through holes 61 of the second circuit board 60. Preferably, each electrical connection between a plated through hole 61 and a conductor 52 is soldered 62.

FIG. 1 shows the original position of the planar portion 15 before it is moved 90 degrees. When the planar portion 15 is moved 90 degrees the rearwardly extending bendable conductor 52 of each contact 50 is bent 90 degrees into position to enter or receive a respective plated through hole 61 in the second circuit board 60.

Having described the invention, what is claimed is:

1. A mounting member for electrical contacts each having a forward mating portion and a rearwardly extending bendable conductor, said mounting member comprised of a plastic one piece molded unitary member characterized by:

a base having a forward end, a rear end and a plurality of passages extending between said forward end and said rear end, each of said passages adapted to receive a respective contact with the bendable conductor of each contact extending from the rear end of said base;

a planar portion extending parallel to the rear end of said base, said planar portion including a plurality of apertures each adapted to receive the rearwardly extending conductor of a respective contact; and a hinge portion integrally connected to said base and said planar portion, said hinge portion dimensioned to allow said planar portion to be moved from its position parallel to the rear end of said base to a position perpendicular to the rear end of said base whereby, when said contacts are mounted in the passages in said base with their respective conductors extending through the apertures in the planar portion of said mounting member and said planar portion is moved 90 degrees, the conductor of each contact is deformed by such motion of the planar portion from a substantially straight shape into one in which it is bent 90 degrees.

2. The mounting member as described in claim 1 wherein the plurality of passages in said base are arranged in at least two rows and wherein the hinge portion between said planar portion and said base is located between said first and second rows.

3. The mounting member as described in claim 2 wherein the apertures in said planar portion are arranged in the same manner as the passages in said base.

4. The mounting member as described in claim 1 wherein said mounting member includes means for maintaining said planar portion in a position 90 degrees from its original position.

5. The mounting member as described in claim 2 wherein said mounting member includes means for maintaining said planar portion in a position 90 degrees from its original position.

6. The mounting member as described in claim 3 wherein said mounting member includes means for maintaining said planar portion in a position 90 degrees from its original position.

* * * * *